(12) United States Patent
Budd et al.

(10) Patent No.: US 8,703,274 B2
(45) Date of Patent: Apr. 22, 2014

(54) MICROCAVITY STRUCTURE AND PROCESS

(75) Inventors: Russell A. Budd, North Salem, NY (US); Bing Dang, Ossining, NY (US); William S. Graham, Irvington, NY (US); Peter Alfred Gruber, Mohegan Lake, NY (US); Richard Levine, Poughkeepsie, NY (US); Da-Yuan Shih, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 1238 days.

(21) Appl. No.: 12/244,067

(22) Filed: Oct. 2, 2008

(65) Prior Publication Data

US 2010/0086739 A1 Apr. 8, 2010

(51) Int. Cl.
*B32B 3/00* (2006.01)
(52) U.S. Cl.
USPC ......................................................... 428/156
(58) Field of Classification Search
USPC .................. 428/131, 156; 228/180.1, 180.21, 228/180.22, 245, 246, 248.1, 248.5, 256; 438/613, 614, 616, 612; 425/110, 112
See application file for complete search history.

(56) References Cited

U.S. PATENT DOCUMENTS

| 5,244,143 A | 9/1993 | Ference et al. |
|---|---|---|
| 5,828,128 A * | 10/1998 | Higashiguchi et al. ....... 257/738 |
| 6,099,935 A | 8/2000 | Brearley et al. |
| 6,105,852 A | 8/2000 | Cordes et al. |
| 6,149,122 A * | 11/2000 | Berger et al. ................. 249/119 |
| 6,332,569 B1 | 12/2001 | Cordes et al. |
| 2001/0015285 A1 | 8/2001 | Nakayama et al. |
| 2008/0164609 A1 | 7/2008 | Gruber et al. |

* cited by examiner

*Primary Examiner* — Catherine A Simone
(74) *Attorney, Agent, or Firm* — Ryan, Mason & Lewis, LLP

(57) ABSTRACT

A microcavity structure is provided. The structure comprises a cavity layout that enables centering of reflowed solder at each of one or more interconnect locations and protrusion of the reflowed solder sufficiently from the cavity to facilitate wetting. Techniques are also provided for producing a microcavity structure, for using injection molded solder (IMS) for micro bumping, as well as for using injection molded solder (IMS) for three-dimensional (3D) packaging.

25 Claims, 13 Drawing Sheets

TOP VIEW

TOP VIEW

MICROCAVITY STRUCTURE AND PROCESS

FIELD OF THE INVENTION

The present invention generally relates to electrical and electronic arts, and, more particularly, to injection molded solder.

BACKGROUND OF THE INVENTION

Injection molded solder (IMS) is a solder process technology applied primarily for silicon wafer bumping, where it is referred to as C4NP. Interconnect requirements continue to change, moving toward ever finer bump sizes and pitches. Especially as three-dimensional (3D) packaging grows, there exists a need for solder interconnects to extend down toward the micro-scale, with bump pitches at 50 microns or less. At such reduced sizes and pitches, standard glass molds used for IMS no longer suffice because of several problems.

For example, in existing approaches, with standard hemispherical cavities, the solder volume after reflow may be located anywhere around the perimeter of the cavity, which produces non-uniformities of location that can adversely affect transfer yields. As seen in other existing approaches, this is due to solder volume centers not aligning with wetting pad centers.

Additionally, as in some existing approaches, decreasing the diameter of the cavity while increasing the depth, which is required to maintain a given volume for a desired pitch, may help keep the reflowed solder centered but will not allow it to protrude from the mold surface sufficiently to assure wetting on the pads.

As such, a new microcavity structure and process for making such is needed to effectively allow IMS to be used for the anticipated micro bump applications required for 3D packaging.

SUMMARY OF THE INVENTION

Principles of the present invention provide techniques for microcavity structure and process. As described herein, a microcavity structure is provided. The structure comprises a cavity layout that enables centering of reflowed solder at each of one or more interconnect locations and protrusion of the reflowed solder sufficiently from the cavity to facilitate wetting.

Techniques are also provided for producing a microcavity structure, wherein producing a microcavity structure includes producing a cavity layout that enables centering of reflowed solder at each of one or more interconnect locations and protrusion of the reflowed solder sufficiently from the cavity to facilitate wetting.

Also, techniques are provided herein for using injection molded solder (IMS) for micro bumping including using a microcavity structure, wherein the structure includes a cavity layout that enables centering of reflowed solder at each of one or more interconnect locations and protrusion of the reflowed solder sufficiently from the cavity to facilitate wetting.

Additionally, techniques are also provided herein for using injection molded solder (IMS) for three-dimensional (3D) packaging including using a microcavity structure, wherein the structure includes a cavity layout that enables centering of reflowed solder at each of one or more interconnect locations and protrusion of the reflowed solder sufficiently from the cavity to facilitate wetting.

These and other objects, features and advantages of the present invention will become apparent from the following detailed description of illustrative embodiments thereof, which is to be read in connection with the accompanying drawings.

DETAILED DESCRIPTION OF PREFERRED EMBODIMENTS

The present invention will be described with reference to illustrative and/or exemplary embodiments. For this reason, numerous modifications can be made to these embodiments and the results will still come within the scope of the invention. No limitations with respect to the specific embodiments described herein are intended or should be inferred.

Principles of the present invention include enhanced microcavity structure and process. One or more embodiments of the invention include microcavities produced that assure that the reflowed solder is consistently centered at each interconnect location. This enhances the transfer yield at micro bump scales. Also, one or more embodiments of the present invention include cross sections of the microcavity structures that assure that the reflowed solder protrudes sufficiently from the cavity to facilitate good wetting.

Such illustrative aspects are described herein in several embodiments, overcoming the problems of existing approaches to cavity design, and are thus advantageous to enabling IMS to be used for micro bumping and 3D packaging applications.

Figure 1:
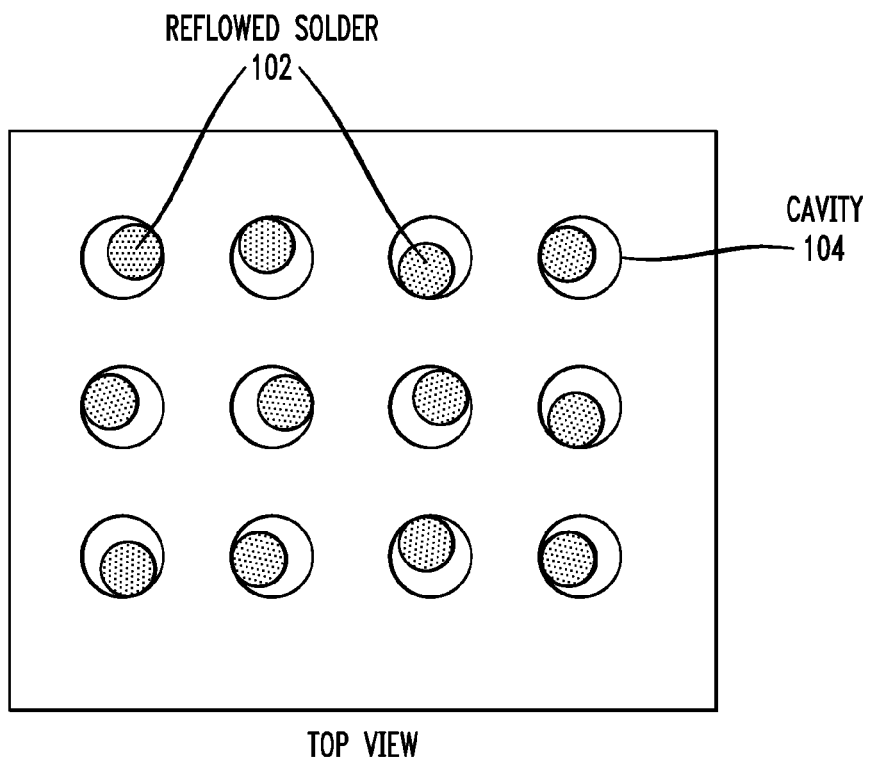
FIG. 1 is a diagram illustrating the top view of an existing solder approach.
Figure 2:
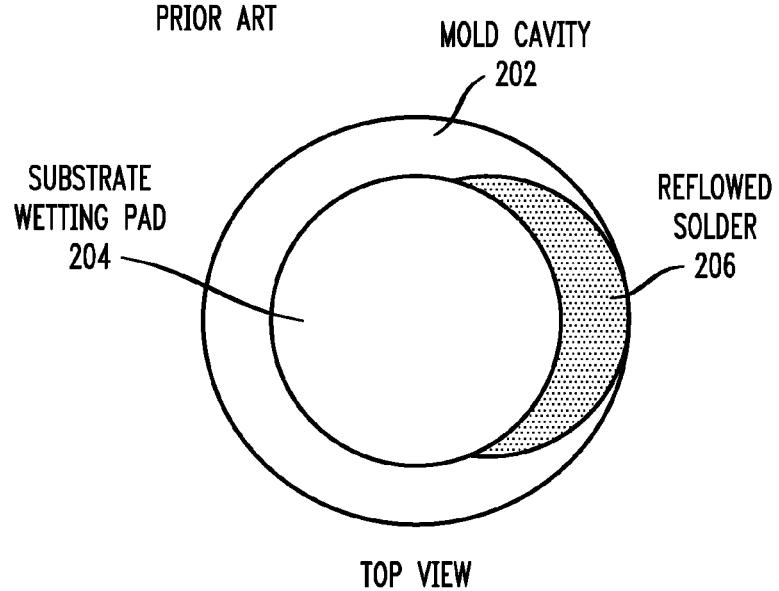
FIG. 2 is a diagram illustrating the top view of an existing solder approach.
Figure 3:
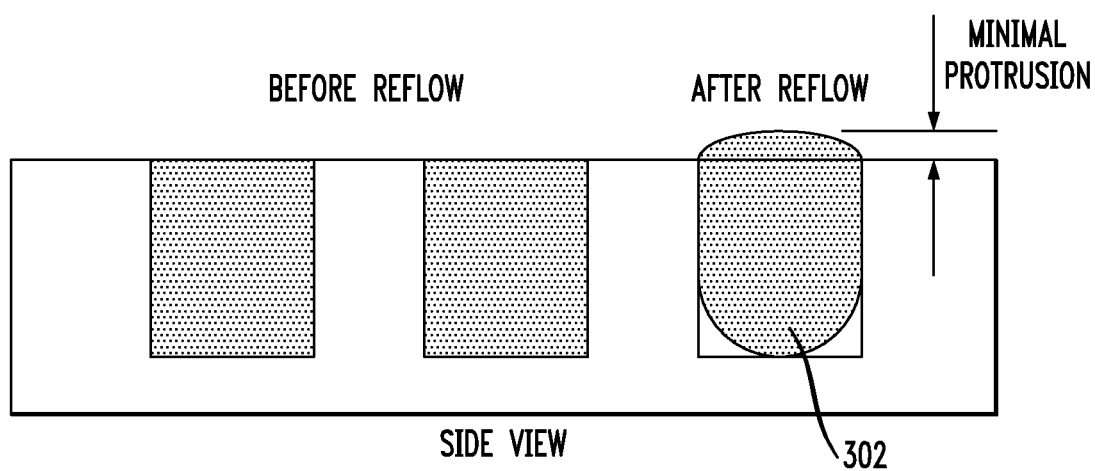
FIG. 3 is a diagram illustrating the side view of an existing solder approach.

FIG. 1 is a diagram illustrating the top view of an existing solder approach depicting reflowed solder 102 and cavities 104. As noted herein, after reflow, solder can be non-uniformly distributed around the cavity perimeter, which decreases transfer yields on pads that have consistent centers at a given pitch. Also, FIG. 2 is a diagram illustrating the top view of an existing solder approach depicting mold cavity 202, substrate wetting pad 204 and reflowed solder 206. FIG. 3 is a diagram illustrating the side view of an existing solder approach depicting reflowed solder 302.

Figure 4:
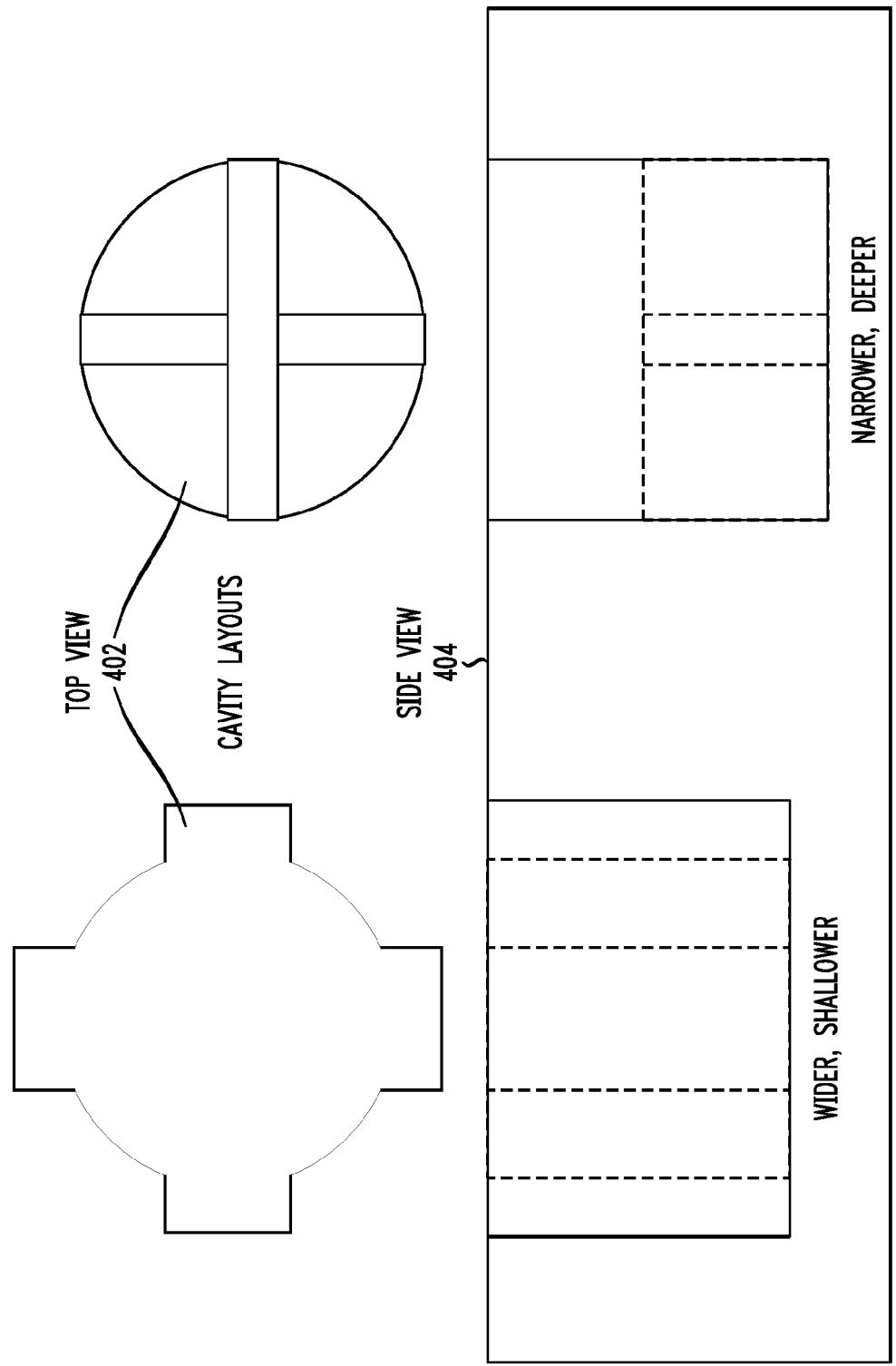
FIG. 4 is a diagram illustrating cavity layouts, according to an embodiment of the present invention.

FIG. 4 is a diagram illustrating cavity layouts, according to an embodiment of the present invention. By way of illustration, FIG. 4 depicts a top view of the cavity layouts 402 and a side view of the cavity layouts 404. As shown in FIG. 4, there are several cavity layouts that enable the centering of the reflowed solder. Some of these have additional vertical cross sectional features to enhance the ability of the reflowed solder to protrude from the cavity sufficiently to enable reliable wetting of the pad during the transfer.

Figure 5:
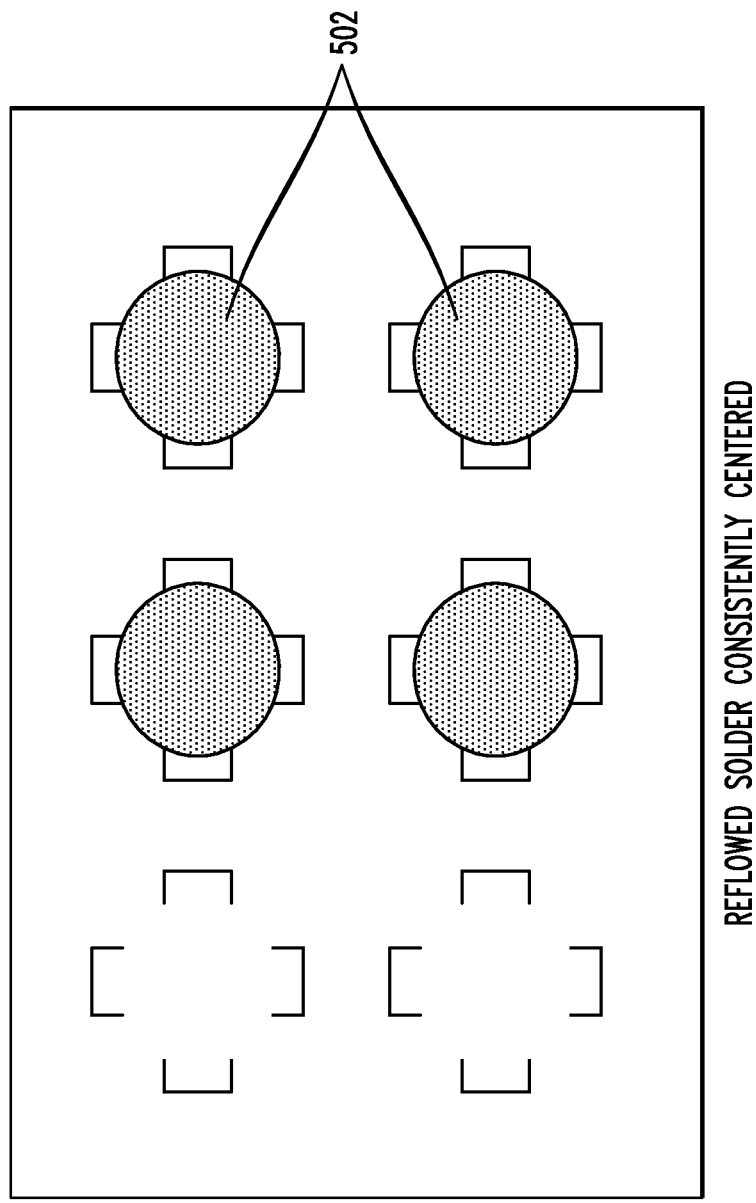
FIG. 5 is a diagram illustrating the top view of a microcavity structure, according to an embodiment of the present invention.

FIG. 5 is a diagram illustrating the top view of a microcavity structure, according to an embodiment of the present invention. By way of illustration, FIG. 5 depicts reflowed solder 502. FIG. 5 shows the first of the above-noted cavity layouts. In this case, the cavity is a modified cross pattern, with the cross arms in line with the X and Y cavity array. This top view shows the reflowed solder consistently centered in the cavities due to surface tension positioning the solder at the cross center.

Figure 6:
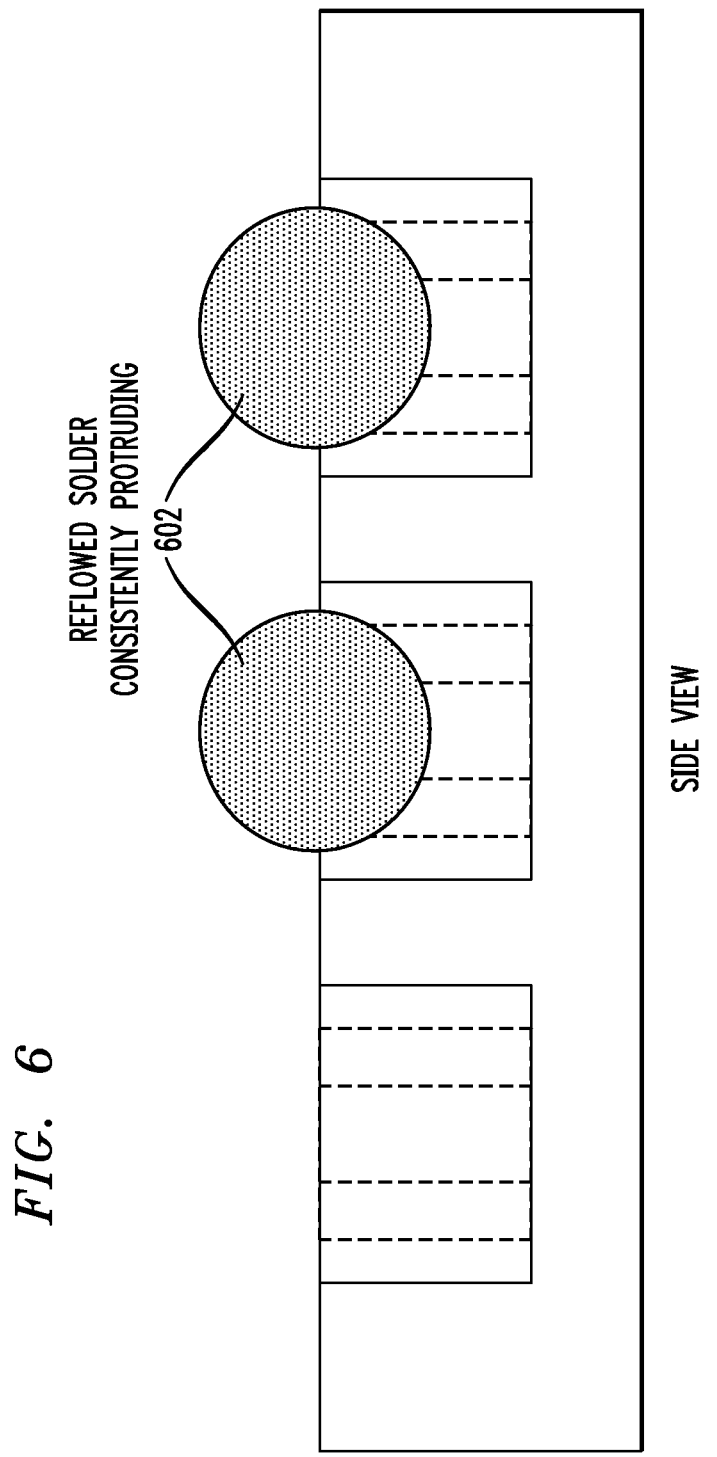
FIG. 6 is a diagram illustrating the side view of a microcavity structure, according to an embodiment of the present invention.
Figure 7:
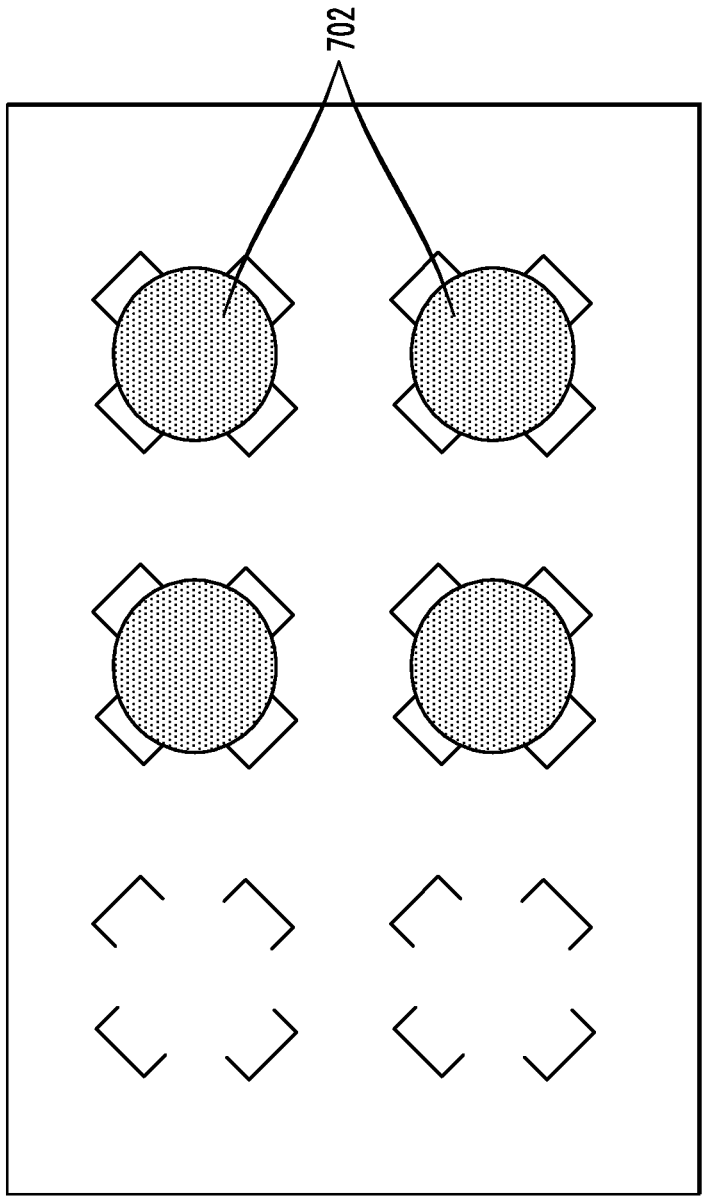
FIG. 7 is a diagram illustrating the top view of a microcavity structure, according to an embodiment of the present invention.

FIG. 6 is a diagram illustrating the side view of a microcavity structure, according to an embodiment of the present invention. By way of illustration, FIG. 6 depicts reflowed solder 602. FIG. 6 shows consistent protrusion due to surface tension of the reflowed solder forcing the solder volume to sit at the cross top. FIG. 7 is a diagram illustrating the top view of a microcavity structure, according to an embodiment of the present invention. By way of illustration, FIG. 7 depicts reflowed solder 702. FIG. 7 illustrates another cavity layout allowing for even closer cavity pitch due to the cavity arms positioned at diagonals to the X and Y array. In the cavity layouts depicted in the figures noted herein, the reflowed solder shows consistent centering of the reflowed solder volumes and significant protrusion from the cavity for robust wetting to the pads during transfer.

Figure 8:
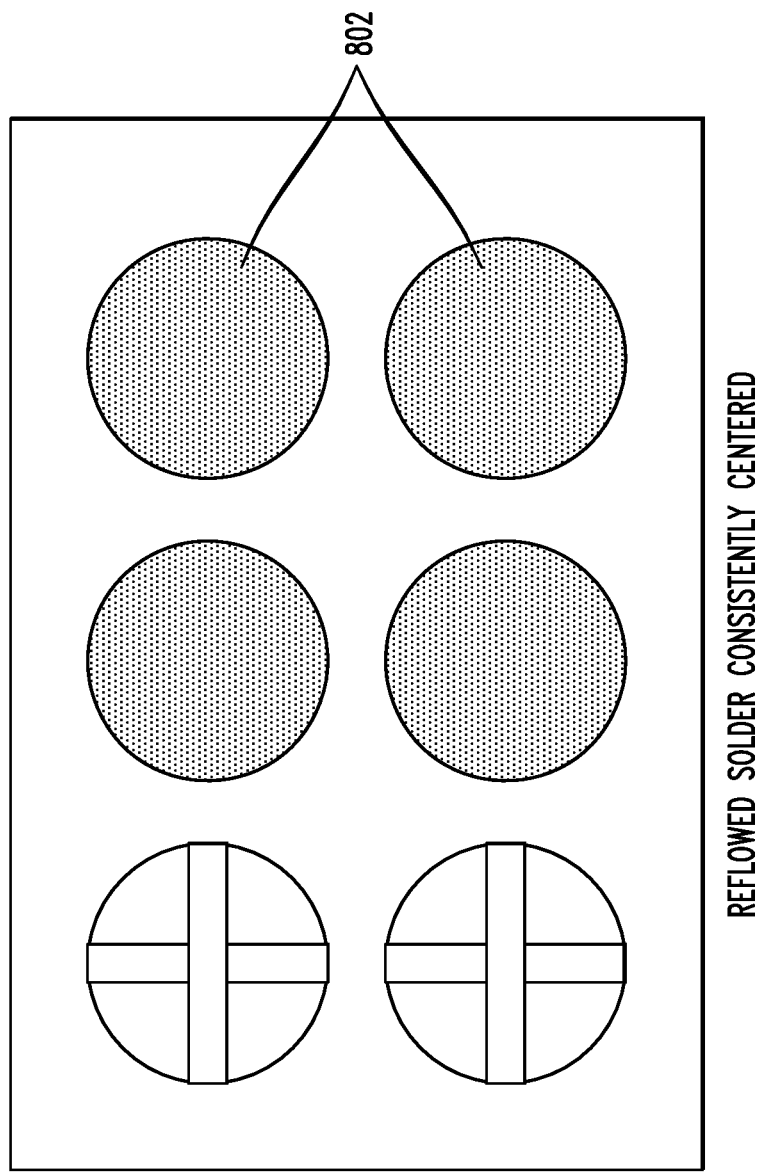
FIG. 8 is a diagram illustrating the top view of a microcavity structure, according to an embodiment of the present invention.
Figure 9:
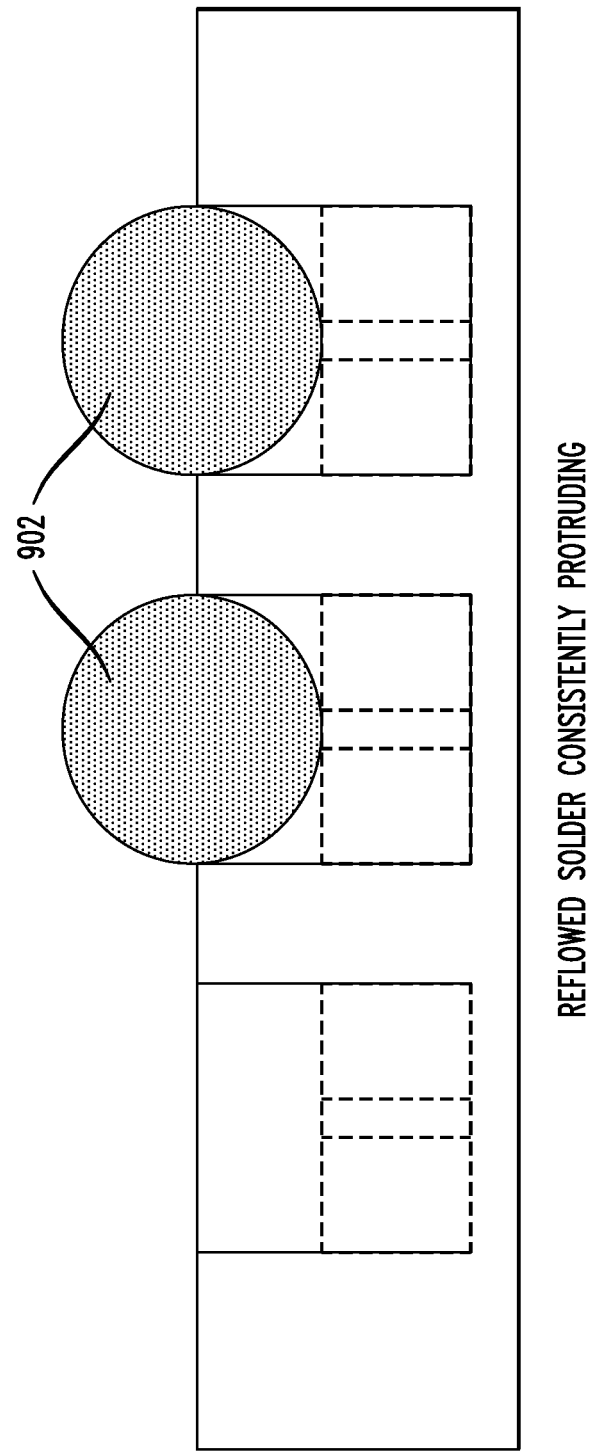
FIG. 9 is a diagram illustrating the side view of a microcavity structure, according to an embodiment of the present invention.

FIG. 8 is a diagram illustrating the top view of a microcavity structure, according to an embodiment of the present invention. By way of illustration, FIG. 8 depicts reflowed solder 802. Also, FIG. 9 is a diagram illustrating the side view of a microcavity structure, according to an embodiment of the present invention. By way of illustration, FIG. 9 depicts reflowed solder 902. FIG. 8 and FIG. 9 show another cavity layout that also achieves consistent centering of the reflowed solder volumes and significant protrusion from the cavity for robust wetting to the pads during transfer, but via different techniques. In the case illustrated in FIG. 8 and FIG. 9, the solder protrusion is caused by the cross pattern within a round cavity.

Figure 10:
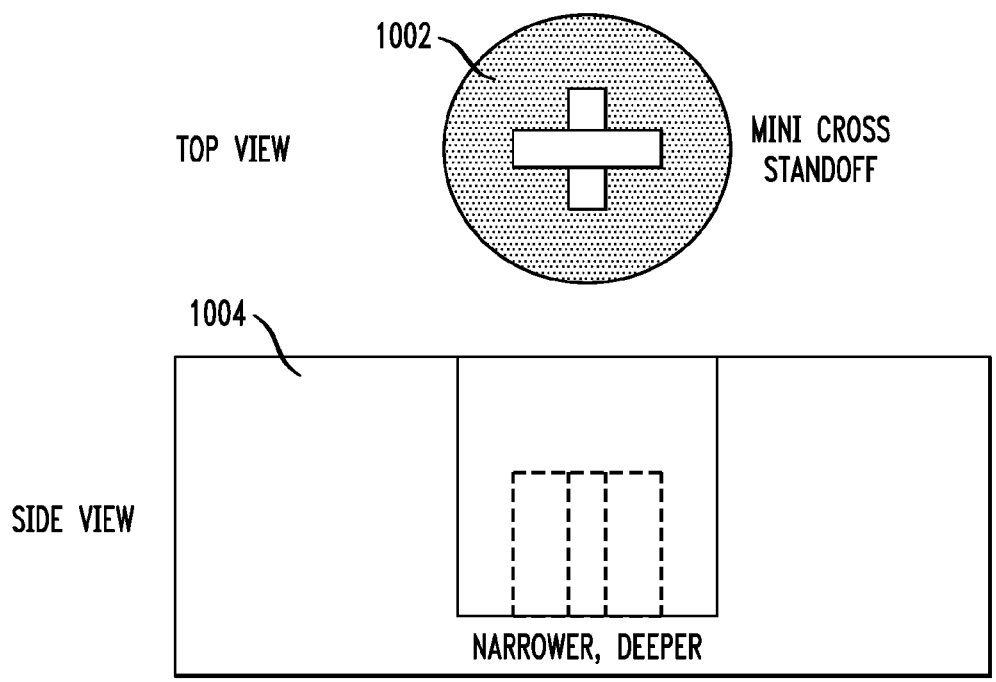
FIG. 10 is a diagram illustrating the top view and side view of a microcavity structure, according to an embodiment of the present invention.

FIG. 10 is a diagram illustrating the top view 1002 and side view 1004 of a microcavity structure, according to an embodiment of the present invention. Also, as shown in FIG. 10, the "standoff" feature can have a variety of configurations (one, for example, being shown in FIG. 10).

Figure 11:
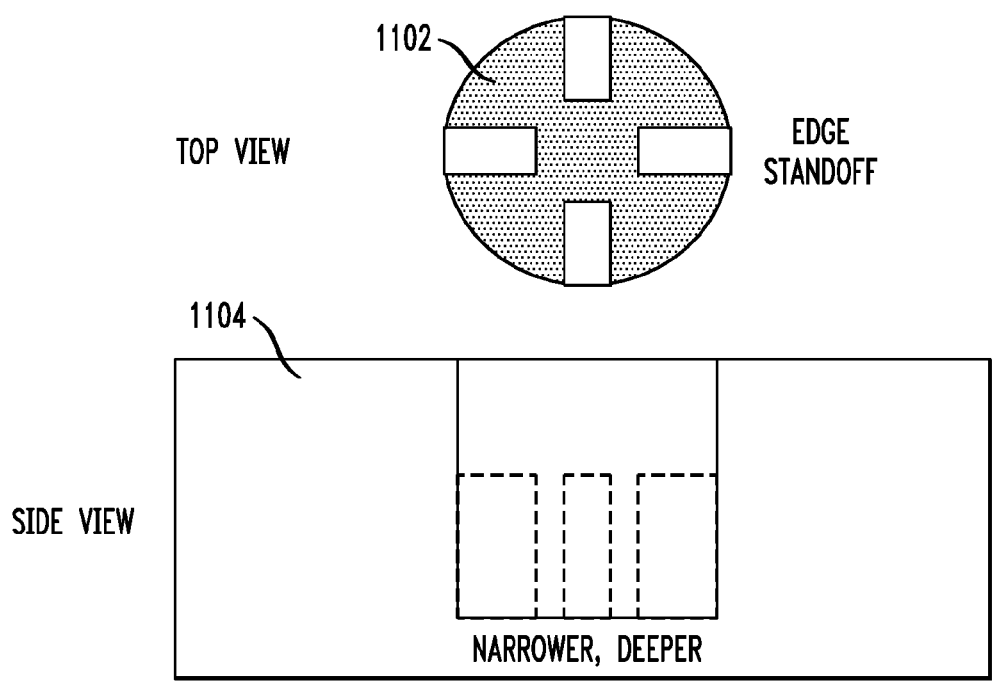
FIG. 11 is a diagram illustrating the top view and side view of a microcavity structure, according to an embodiment of the present invention.
Figure 12:
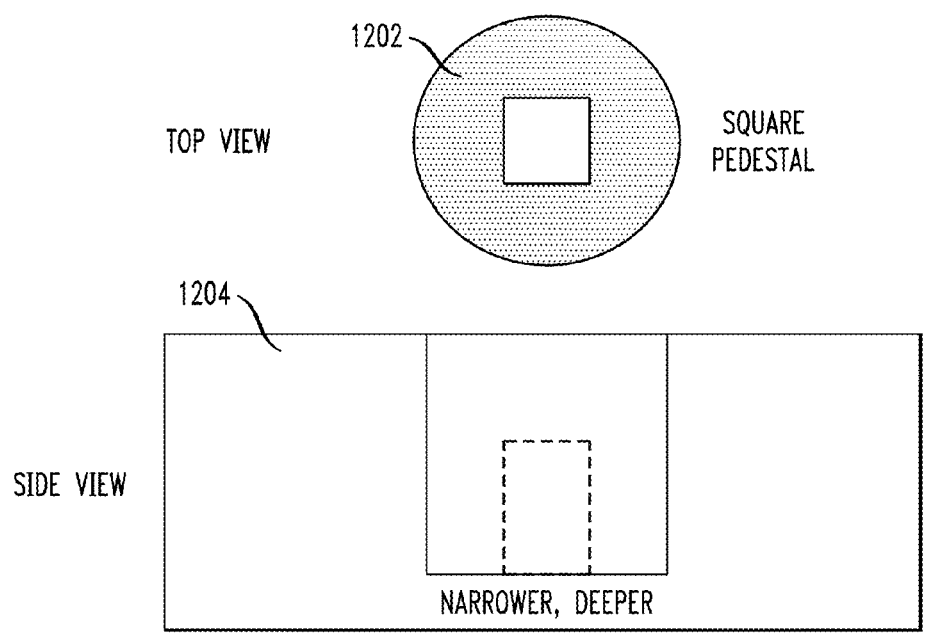
FIG. 12 is a diagram illustrating the top view and side view of a microcavity structure, according to an embodiment of the present invention.
Figure 13:
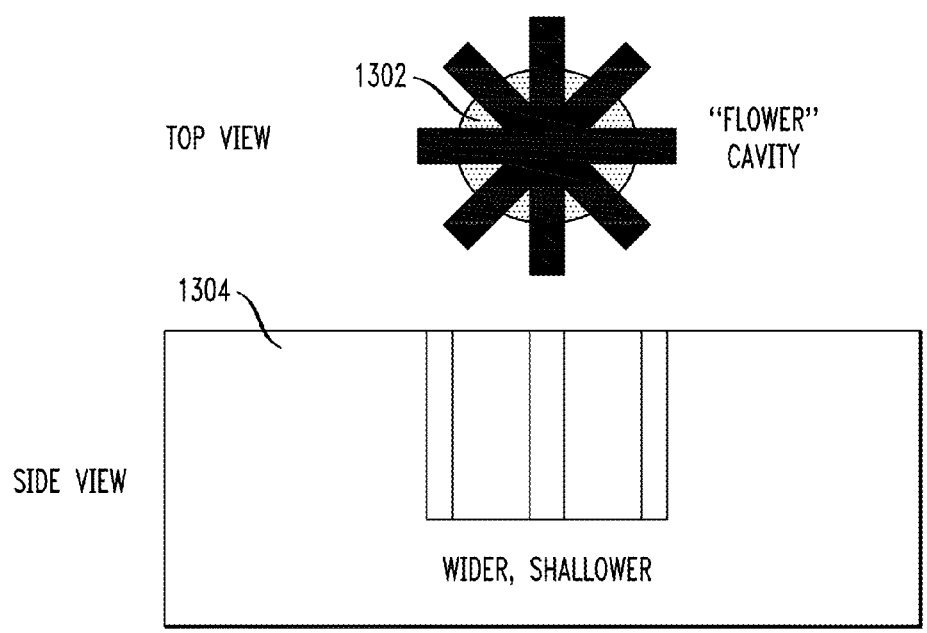
FIG. 13 is a diagram illustrating the top view and side view of a microcavity structure, according to an embodiment of the present invention.

FIG. 11, FIG. 12 and FIG. 13 detail yet further microcavity embodiments. FIG. 11 is a diagram illustrating the top view 1102 and side view 1104 of a microcavity structure, according to an embodiment of the present invention. FIG. 11 depicts edge oriented standoffs that cause the solder to protrude in a narrower, deeper cavity configuration. FIG. 12 is a diagram illustrating the top view 1202 and side view 1204 of a microcavity structure, according to an embodiment of the present invention. FIG. 12 depicts a square pedestal centrally located at the cavity base to achieve solder protrusion, also in a narrower, deeper cavity configuration.

FIG. 13 is a diagram illustrating the top view 1302 and side view 1304 of a microcavity structure, according to an embodiment of the present invention. FIG. 13 depicts a flower cavity with radially oriented spokes that produce centering and protrusion once the solder in the cavity is reflowed, but in a wider, shallower cavity configuration.

As illustrated by the figures and description herein, many different cavity shapes and configurations are possible, and the included examples merely show the variety types and are not meant to limit the scope. As such, the techniques described herein include novel microcavity arrays that overcome the limitations which arise by, for example, scaling down cavity shapes used for standard C4NP wafer bumping.

Figure 14:
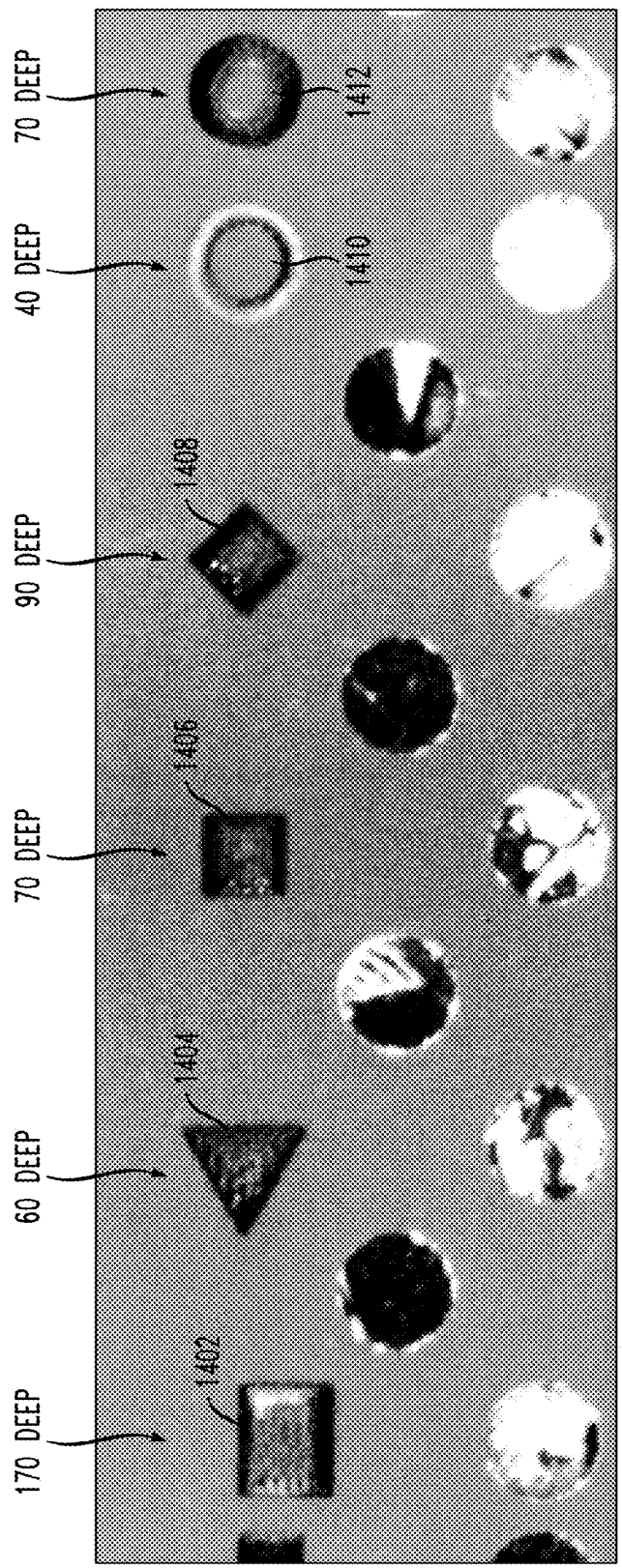
FIG. 14 is a diagram illustrating microcavity structures, according to an embodiment of the present invention.
Figure 15:
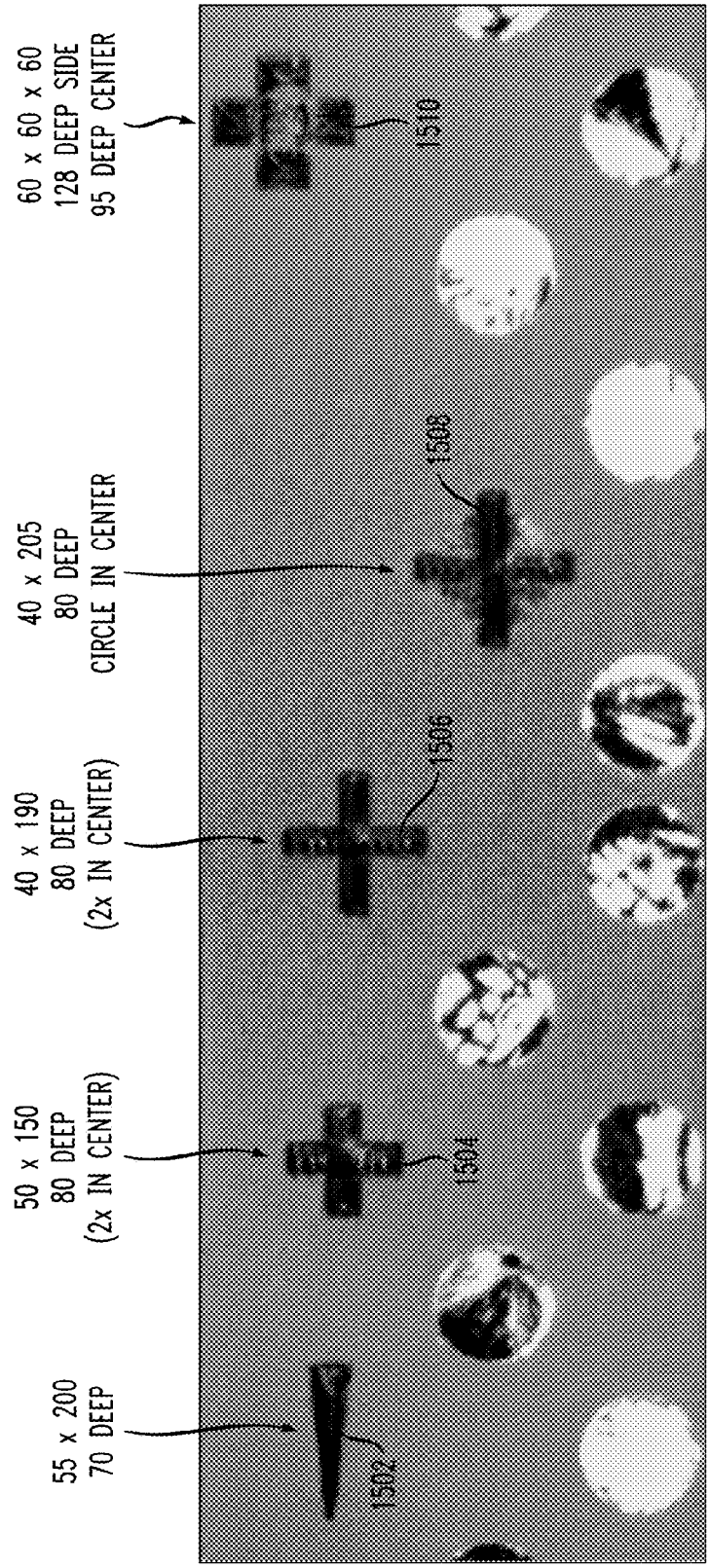
FIG. 15 is a diagram illustrating microcavity structures, according to an embodiment of the present invention.

FIG. 14 is a diagram illustrating microcavity structures, according to an embodiment of the present invention. By way of illustration, FIG. 14 depicts cavities 1402, 1404, 1406, 1408, 1410 and 1412 of varying and specified depths. Also, FIG. 15 is a diagram illustrating microcavity structures, according to an embodiment of the present invention. By way of illustration, FIG. 15 depicts cavities 1502, 1504, 1506, 1508 and 1510, each with specified dimensions and depth. FIG. 14 and FIG. 15 depict irregular cavities shapes fabricated by laser ablation and filled with a mold fill tool.

Figure 16:
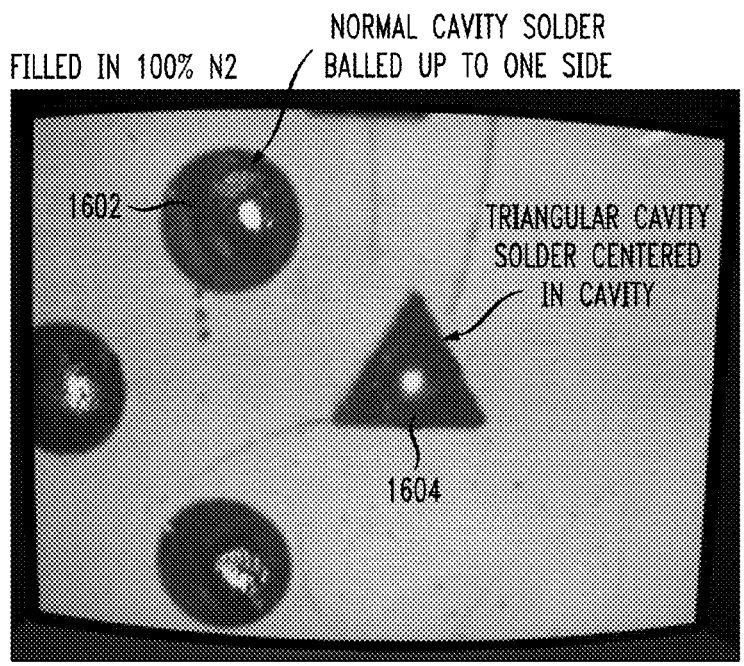
FIG. 16 is a diagram illustrating microcavity structures, according to an embodiment of the present invention.
Figure 17:
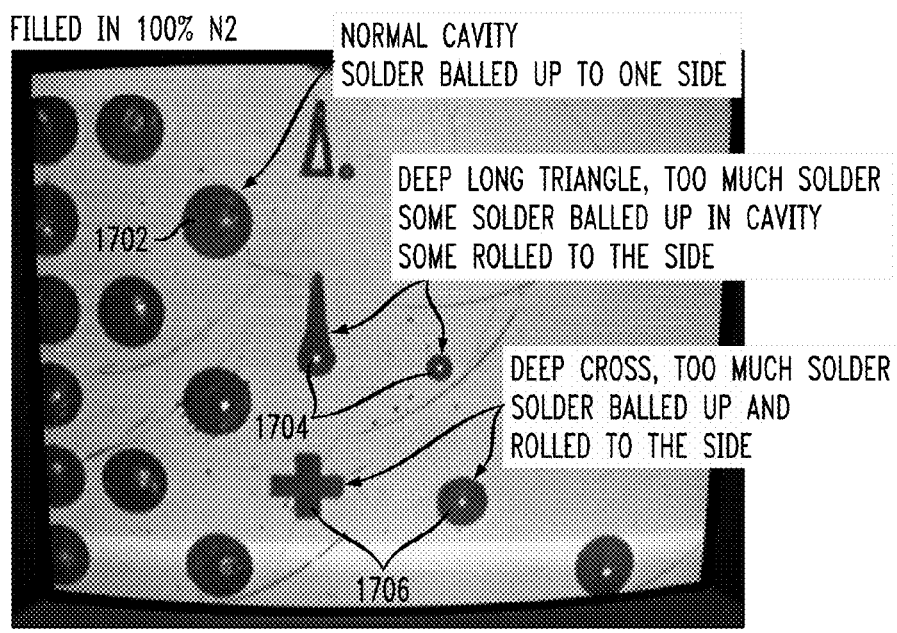
FIG. 17 is a diagram illustrating microcavity structures, according to an embodiment of the present invention.

FIG. 16 is a diagram illustrating microcavity structures, according to an embodiment of the present invention. By way of illustration, FIG. 16 depicts a normal cavity 1602 with the solder balled up to one side, and a triangular cavity 1604 with the solder centered in the cavity. Also, FIG. 17 is a diagram illustrating microcavity structures, according to an embodiment of the present invention. FIG. 17 depicts a normal cavity 1702 with the solder balled up to one side. Additionally, FIG. 17 depicts components 1704 including a deep long triangle with too much solder, wherein some solder balled up in the cavity and some solder rolled to the side. Further, FIG. 17 depicts components 1706 including a deep cross with too much solder, wherein some solder balled up in the cavity and some solder rolled to the side.

As described herein, one or more embodiments of the present invention include a microcavity structure and techniques for producing the same, wherein the structure includes a cavity layout that enables centering (for example, consistent centering) of reflowed solder at interconnect locations and protrusion of the reflowed solder sufficiently from the cavity to facilitate wetting (for example, robust wetting to the pads during transfer).

The cavity layout, as described herein, redistributes a solder volume from an initially injected and solidified shape to a new shape that is centered and protrudes after a reflow step allows solder surface tension to produce the new shape. As detailed above, the cavity layout can include vertical cross sectional features to facilitate protrusion of the reflowed solder sufficiently from the cavity, as well as a modified cross pattern, wherein cross arms are in line with an X cavity array and a Y cavity array.

Also, the cavity layout can include cavity arms positioned at diagonals to an X cavity array and a Y cavity array, as well as a cross pattern within a round cavity. The cavity layout can also include standoff features (for example, edge-oriented standoffs that cause solder to protrude in a cavity configuration (for example, a narrower, deeper cavity configuration)). A "standoff" can include part of a feature that contributes to the redistribution of the reflowed solder volume described herein. A "standoff" "lifts" the reflowed solder volume by solder surface tension. Further, the cavity layout can include a square pedestal, wherein the square pedestal is centrally located at a cavity base (for example, to facilitate solder protrusion for example, in a narrower, deeper cavity configuration).

Additionally, as described herein, the cavity layout can include a flower cavity with radially oriented spokes. Such a cavity layout can, for example, facilitate centering and protrusion when solder in the cavity is reflowed for example, in a wider, shallower cavity configuration. The cavity layout can also include one or more irregular cavity shapes fabricated by laser ablation.

One or more embodiments of the present invention include using injection molded solder (IMS) for micro bumping and/or three-dimensional (3D) packaging, which includes using a microcavity structure, wherein the microcavity structure includes a cavity layout that enables centering of reflowed solder at each of one or more interconnect locations and protrusion of the reflowed solder sufficiently from the cavity to facilitate wetting.

At least one embodiment of the invention may provide one or more beneficial effects, such as, for example, assuring that the reflowed solder is consistently centered at each interconnect location.

It will be appreciated and should be understood that the exemplary embodiments of the invention described above can be implemented in a number of different fashions. Given the teachings of the invention provided herein, one of ordinary skill in the related art will be able to contemplate other implementations of the invention.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

What is claimed is:

1. A microcavity structure, wherein the structure comprises a cavity layout that enables centering of reflowed solder at each of one or more interconnect locations and protrusion of the reflowed solder sufficiently from the cavity to facilitate wetting, wherein said cavity comprises:
 a cylindrical cavity in a mold comprising a first circular surface, a second circular surface, and a cylindrical surface; and
 at least one of the following:
 1) one or more trenches abutting one of said first circular surface and said second circular surface;
 2) one or more trenches, each of said one or more trenches abutting a portion of said cylindrical surface; and
 3) a cross-shaped pedestal.

2. The microcavity structure of claim 1, wherein the cavity layout redistributes a solder volume from an initially injected and solidified shape to a new shape that is centered and protrudes after a reflow step allows solder surface tension to produce the new shape.

3. The microcavity structure of claim 1, wherein the cavity layout comprises one or more vertical cross sectional features to facilitate protrusion of the reflowed solder sufficiently from the cavity.

4. The microcavity structure of claim 1, wherein the cavity layout comprises a modified cross pattern, wherein cross arms are in line with an X cavity array and a Y cavity array.

5. The microcavity structure of claim 1, wherein the cavity layout comprises one or more cavity arms positioned at diagonals to an X cavity array and a Y cavity array.

6. The microcavity structure of claim 1, wherein the cavity layout comprises a cross pattern within a round cavity.

7. The microcavity structure of claim 1, wherein the cavity layout comprises one or more standoff features.

8. The microcavity structure of claim 7, wherein the cavity layout comprises one or more edge-oriented standoffs, wherein the one or more edge-oriented standoffs cause solder to protrude in a cavity configuration.

9. The microcavity structure of claim 1, wherein the cavity layout comprises a square pedestal, wherein the square pedestal is centrally located at a cavity base.

10. The microcavity structure of claim 1, wherein the cavity layout comprises a flower cavity with one or more radially oriented spokes.

11. The microcavity structure of claim 1, wherein the cavity layout comprises one or more irregular cavity shapes fabricated by laser ablation.

12. A method for producing a microcavity structure, comprising producing a cavity layout that enables centering of reflowed solder at each of one or more interconnect locations and protrusion of the reflowed solder sufficiently from the cavity to facilitate wetting, wherein said cavity comprises:
 a cylindrical cavity in a mold comprising a first circular surface, a second circular surface, and a cylindrical surface; and
 at least one of the following:
 1) one or more trenches abutting one of said first circular surface and said second circular surface;
 2) one or more trenches, each of said one or more trenches abutting a portion of said cylindrical surface; and
 3) a cross-shaped pedestal.

13. The method of claim 12, wherein the cavity layout redistributes a solder volume from an initially injected and solidified shape to a new shape that is centered and protrudes after a reflow step allows solder surface tension to produce the new shape.

14. The method of claim 12, wherein the cavity layout comprises one or more vertical cross sectional features to facilitate protrusion of the reflowed solder sufficiently from the cavity.

15. The method of claim 12, wherein the cavity layout comprises a modified cross pattern, wherein cross arms are in line with an X cavity array and a Y cavity array.

16. The method of claim 12, wherein the cavity layout comprises one or more cavity arms positioned at diagonals to an X cavity array and a Y cavity array.

17. The method of claim 12, wherein the cavity layout comprises a cross pattern within a round cavity.

18. The method of claim 12, wherein the cavity layout comprises one or more standoff features.

19. The method of claim 18, wherein the cavity layout comprises one or more edge-oriented standoffs, wherein the one or more edge-oriented standoffs cause solder to protrude in a cavity configuration.

20. The method of claim 12, wherein the cavity layout comprises a square pedestal, wherein the square pedestal is centrally located at a cavity base.

21. The method of claim 12, wherein the cavity layout comprises a flower cavity with one or more radially oriented spokes.

22. The method of claim 12, wherein the cavity layout comprises one or more irregular cavity shapes fabricated by laser ablation.

23. A method for using injection molded solder (IMS) for micro bumping, comprising using a microcavity structure for micro bumping, wherein the microcavity structure comprises a cavity layout that enables centering of reflowed solder at each of one or more interconnect locations and protrusion of the reflowed solder sufficiently from the cavity to facilitate wetting, wherein said cavity comprises:
 a cylindrical cavity in a mold comprising a first circular surface, a second circular surface, and a cylindrical surface; and
 at least one of the following:
  1) one or more trenches abutting one of said first circular surface and said second circular surface;
  2) one or more trenches, each of said one or more trenches abutting a portion of said cylindrical surface; and
  3) a cross-shaped pedestal.

24. A method for using injection molded solder (IMS) for three-dimensional (3D) packaging, comprising using a microcavity structure for 3D packaging, wherein the microcavity structure comprises a cavity layout that enables centering of reflowed solder at each of one or more interconnect locations and protrusion of the reflowed solder sufficiently from the cavity to facilitate wetting, wherein said cavity comprises:
 a cylindrical cavity in a mold comprising a first circular surface, a second circular surface, and a cylindrical surface; and
 at least one of the following:
  1) one or more trenches abutting one of said first circular surface and said second circular surface;
  2) one or more trenches, each of said one or more trenches abutting a portion of said cylindrical surface; and
  3) a cross-shaped pedestal.

25. A plurality of microcavity structures, wherein each microcavity structure comprises a cavity layout that enables centering of reflowed solder at each of one or more interconnect locations and protrusion of the reflowed solder sufficiently from the cavity to facilitate wetting, wherein each cavity comprises:
 a cylindrical cavity in a mold comprising a first circular surface, a second circular surface, and a cylindrical surface; and
 at least one of the following:
  1) one or more trenches abutting one of said first circular surface and said second circular surface;
  2) one or more trenches, each of said one or more trenches abutting a portion of said cylindrical surface; and
  3) a cross-shaped pedestal; and
 wherein at least one trench of one of said plurality of microcavity structures is oriented perpendicular to at least one trench of a neighboring microcavity structure.

* * * * *